United States Patent [19]

Ikebe et al.

[11] Patent Number: 5,721,701
[45] Date of Patent: Feb. 24, 1998

[54] HIGH READ SPEED MULTIVALUED READ ONLY MEMORY DEVICE

[75] Inventors: Masazumi Ikebe; Teiichirou Nishizaka, both of Tokyo, Japan

[73] Assignee: NEC Corporation, Tokyo, Japan

[21] Appl. No.: 639,753

[22] Filed: Apr. 29, 1996

[30] Foreign Application Priority Data

Apr. 28, 1995 [JP] Japan .................................. 7-105182

[51] Int. Cl.$^6$ .................................................. G11C 11/34
[52] U.S. Cl. ...................... 365/185.03; 365/185.18; 365/185.24
[58] Field of Search .......................... 365/185.03, 185.24, 365/185.14, 185.18

[56] References Cited

U.S. PATENT DOCUMENTS 5,394,362  2/1995  Baanks ........................ 315/185.03

FOREIGN PATENT DOCUMENTS 53-81024  7/1978  Japan .
4-184794  7/1992  Japan .

Primary Examiner—David C. Nelms
Assistant Examiner—Hoai V. Ho
Attorney, Agent, or Firm—Sughrue, Mion, Zinn, Macpeak & Seas, PLLC

[57] ABSTRACT

In a multivalued ROM device including a plurality of memory cells each for storing N (N=2, 3, . . . )-bit information, each bit of the N-bit information corresponds to one address.

20 Claims, 16 Drawing Sheets

Fig. 7

| VT | LA1 | LA2 | LA3 | G1 | G2 | G3 |
|---|---|---|---|---|---|---|
| VT3 | 1 | 1 | 1 | 0 | 1 | 1 |
| VT2 | 1 | 1 | 0 | 0 | 0 | 0 |
| VT1 | 1 | 0 | 0 | 1 | 0 | 1 |
| VT0 | 0 | 0 | 0 | 0 | 0 | 0 |

Fig. 10

| MEMORY CELL | THRESHOLD VOLTAGE |
|---|---|
| C(0,0) | VT1 |
| C(0,1) | VT2 |
| C(0,2) | VT3 |
| C(0,3) | VT0 |
| C(1,0) | VT0 |
| C(1,1) | VT2 |
| C(1,2) | VT2 |
| C(1,3) | VT2 |
| ⋮ | ⋮ |
| C($2^m$,0) | VT2 |
| C($2^m$,1) | VT1 |
| C($2^m$,2) | VT0 |
| C($2^m$,3) | VT0 |

Fig. 11

| CYCLE | Xm ··· X2 X1 X0 | SELECTED WORD LINE | D0 | D1 | D2 | D3 |
|---|---|---|---|---|---|---|
| 1 | 0 ··· 0 0 0 | WL0 | 0 | 1 | 1 | 0 |
| 2 | 0 ··· 0 0 0 | WL0 | 1 | 0 | 1 | 0 |
| 3 | 0 ··· 0 1 0 | WL1 | 0 | 1 | 1 | 1 |
| 4 | 0 ··· 0 1 1 | WL1 | 0 | 0 | 0 | 0 |
| ⋮ | ⋮ | ⋮ | ⋮ | | | |
| $2^{m+1}-1$ | 1 ··· 1 1 0 | $WL2^m$ | 1 | 0 | 0 | 0 |
| $2^{m+1}$ | 1 ··· 1 1 1 | $WL2^m$ | 0 | 1 | 0 | 0 |

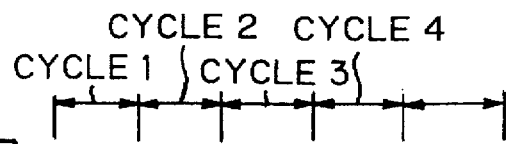
Fig. 16A ALE
Fig. 16B EXTERNAL X1~Xm
Fig. 16C INTERNAL X1~Xm
Fig. 16D INTERNAL X0
Fig. 16E CLK0
Fig. 16F P
Fig. 16G SD
Fig. 16H L2
Fig. 16I L1
Fig. 16J L3
Fig. 16K SL
Fig. 16L L0
Fig. 16M D0~D3
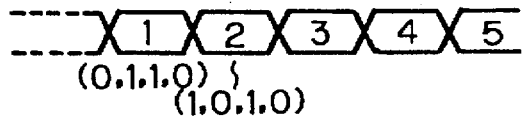

HIGH READ SPEED MULTIVALUED READ ONLY MEMORY DEVICE

BACKGROUND OF THE INVENTION

1. Field of the Invention

The present invention relates to a multivalued read only memory (ROM) device having memory cells each storing N (N=2, 3, ... ), bit information, and more particularly, to a multivalued ROM device capable of carrying out a high read speed operation in a sequential access.

2. Description of the Related Art

In a ROM device, if N-bit information is stored in each memory cell, the storage capacity becomes N times that of a conventional ROM device. In order to meet this requirement, multivalued ROM devices having memory cells each storing N-bit information have recently been developed.

In a first prior art four-valued ROM device including memory cells each storing two-bit information, each of the memory cells is connected to one digit line which is also connected to two-bit output terminals. In a read operation, when an address is given to the device, three kinds of threshold voltages are applied to a selected word line. Therefore, three time periods for generating the three kinds of threshold voltages are required for one read access, thus decreasing a read operation speed (see: JP-A-53-81024). This will be explained later in detail.

In a second prior art four-valued ROM device including memory cells each storing two-bit information, each of the memory cells is connected to one digit line. A plurality of digit lines are selectively connected to two-bit output terminals. In a read operation, when an address is given to the device, a center one of the three kinds of threshold voltages is applied to a selected word line. Then, a lower one or a higher one of the three kinds of threshold voltages is applied to the selected word line. Therefore, only two time periods for generating the two kinds of threshold voltages are required for one read access, thus increasing a read operation speed (see: JP-A-4-184794). This also will be explained later in detail.

In the second prior art four-valued ROM device, however, one read access is performed upon only one of the digit lines. Therefore, if four bit data signals are obtained, it takes four time periods. Therefore, a read operation speed is decreased. In addition, a circuit configuration is more complex than that of the first prior art four-valued ROM device.

SUMMARY OF THE INVENTION

It is an object of the present invention to provide a multivalued ROM device such as a four-valued ROM device capable of carrying out a high read speed operation.

According to the present invention, in a multivalued ROM device including a plurality of memory cells each for storing N (N=2, 3, ... )-bit information, each bit of the N-bit information corresponds to one address. In other words, one bit of the N-bit information is read from one memory cell in accordance with one address, and another bit is read from the same memory cell in accordance with another address.

Thus, in a read access determined by one address, only one bit information is read from a selected memory cell, and the other (N−1), bit information is not read from the selected memory cell. This reduces the number of threshold voltages applied to the selected memory cell, thus increasing a read operation speed.

BRIEF DESCRIPTION OF THE DRAWINGS

The present invention will be more clearly understood from the description as set forth below, as compared with the prior art, with reference to the accompanying drawings, wherein:

FIG. 7 is a table showing the state of the determination circuit of FIG. 6;

FIG. 10 is a table showing an example of the relationship between the memory cells of FIG. 5 and their threshold voltages;

FIG. 11 is a table showing an example of the output data of FIG. 5;

FIGS. 16A through 16M are timing diagrams for explaining the operation of the circuits of FIGS. 6, 13, 14 and 15.

DESCRIPTION OF THE PREFERRED EMBODIMENTS

Before the description of the preferred embodiments, prior art four-valued ROM devices will be explained with reference to FIGS. 1, 2, 3 and 4.

Figure 1:
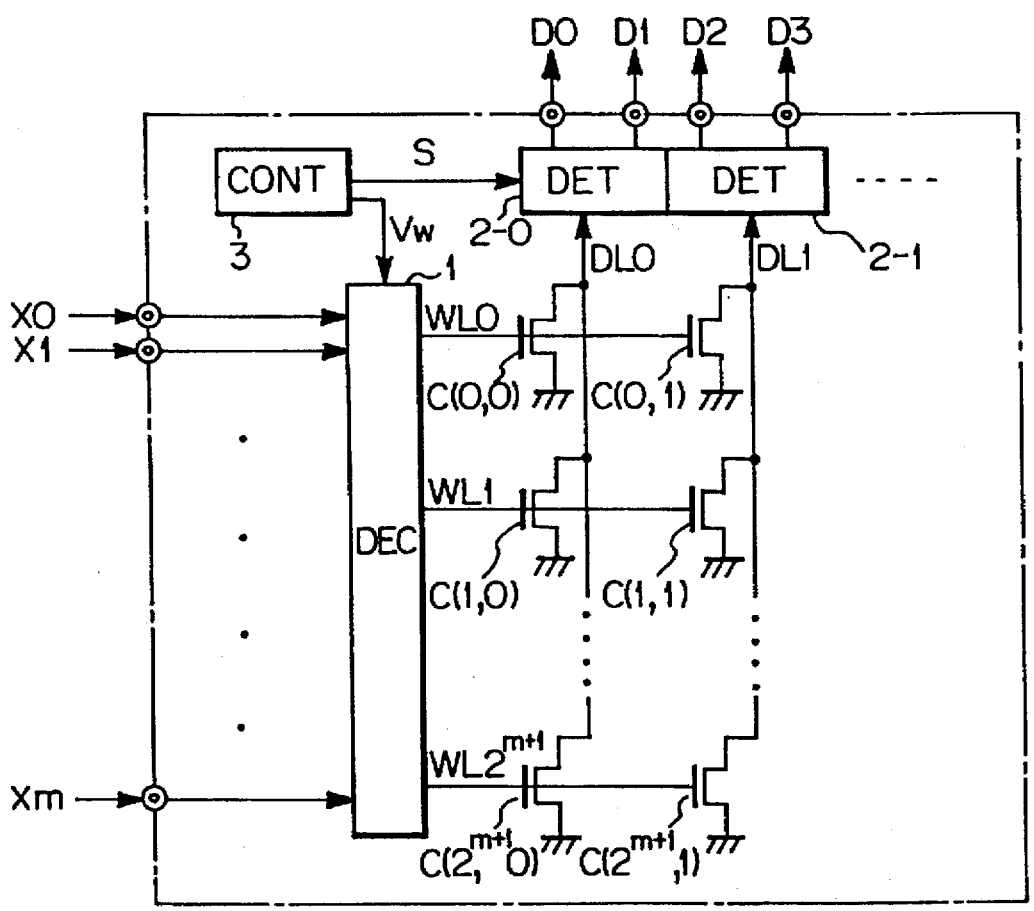
FIG. 1 is a circuit diagram illustrating a first prior art four-valued ROM device.

In FIG. 1, which illustrates a first prior art four-valued ROM device (see: JP-A-53-81024), reference numeral 1 designates a row decoder for receiving X address signals X0, X1, ..., Xm to select one of word lines WL0, WL1, ..., WL2$^{m+1}$.

Also, two digit lines DL0 and DL1 are provided and connected to determination circuits 2-0 and 2-1, respectively. The determination circuit 2-0 has two data output terminals D0 and D1, and the determination circuit 2-1 has two data output terminals D2 and D3. The row decoder 1 and the determination circuits 2-0 and 2-1 are controlled by a control circuit 3.

Further, memory cells C(0, 0), C(0, 1), C(1, 0), C(1, 1), ..., C(2$^{m+1}$, 0), C(2$^{m+1}$, 1) are provided at intersections between the word lines WL0, WL1, ..., WL2$^{m+1}$ and the digit lines DL0 and DL1. There are four kinds of threshold voltages VT0, VT1, VT2 and VT3 for the memory cells, and one of the threshold voltages is written into each of the memory cells in advance. That is, two-bit information is written into each of the memory cells.

Figure 2:
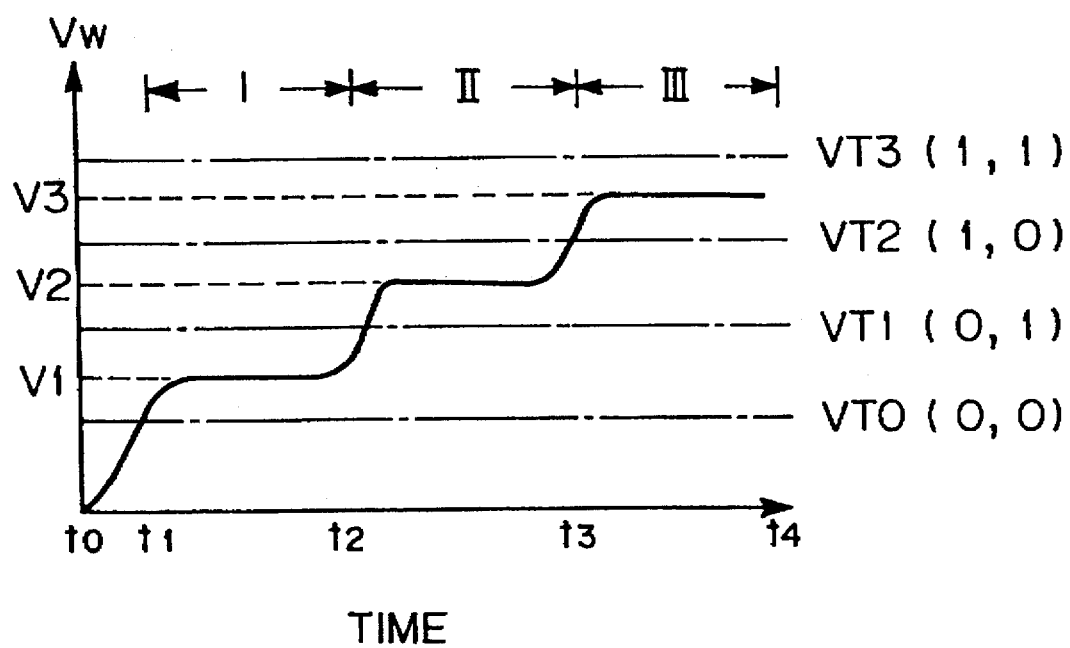
FIG. 2 is a timing diagram showing the read operation of the device of FIG. 1.

The read operation of the device of FIG. 1 is explained next with reference to FIG. 2. Here, assume that the X address signals X0, X1, ..., Xm are all 0, and accordingly, the word line WL0 is selected. In this state, the control circuit 3 generates a voltage $V_w$ and transmits it to the X decoder 1, so that the voltage $V_w$ at the word line WL0 is changed. That is, as shown in FIG. 2, for a time period I from t1 to t2, the voltage $V_w$ at the word line WL0 is V1 between VT0 and VT1; for a time period II from t2 to t3, the voltage $V_w$ at the word line WL0 is V2 between VT1 and VT2; and for a time period III from t3 to t4, the voltage $V_w$ at the word line WL0 is V3 between VT2 and VT3.

The control signal S of the control circuit 3 is also supplied to both the determination circuits 2-0 and 2-1. As a result, the determination circuits 2-0 and 2-1 generate the data signals D0, D1, D2 and D3 in accordance with whether or not voltages at the digit lines DL0 and DL1 are 0. For example, in the determination circuit 2-0, if the voltage at the digit line DL0 is 0V for the time period I the threshold voltage of the memory cell C(0, 0) is VT0, so that the determination circuit 2-0 causes the data signals (D0, D1) to be (0, 0). Also, if the voltage at the digit line DL0 is 0V for the time period II, the threshold voltage of the memory cell C(0, 0) is VT1, so that the determination circuit 2-0 causes the data signals (D0, D1) to be (0, 1). Further, if the voltage at the digit line DL0 is 0V for the time period III, the threshold voltage of the memory cell C(0, 0) is VT2, so that the determination circuit 2-0 causes the data signals (D0, D1) to be (1, 0). In addition, if the voltage at the digit line DL0 is not 0V, i.e., a precharged voltage for the time period III, the threshold voltage of the memory cell C(0, 0) is VT3, so that the determination circuit 2-0 causes the data signals (D0, D1) to be (1, 1). The same is true in the determination circuit 2-1.

Also, if the threshold voltages of the selected memory cells C(0, 0) and C(0, 1) are VT1 and VT2, respectively, the data signals (D0, D1, D2, D3) are (0, 1, 1, 0). If the selected memory cells C(1, 0) and C(1, 1) are both VT2, the data signals (D0, D1, D2, D3) are (1, 0, 1, 0). Therefore, four-bit data (D0, D1, D2, D3) is stored in two memory cells, that is, the two upper bits are stored in one of the memory cells and the two lower bits are stored in the other of the memory cells. Thus, the ROM device can store twice as much information as the conventional ROM device.

In the four-valued ROM device of FIG. 1, however, it takes three time periods I, II and III to obtain the data signals (D0, D1, D2, D3), thus decreasing a read operation speed.

Figure 3:
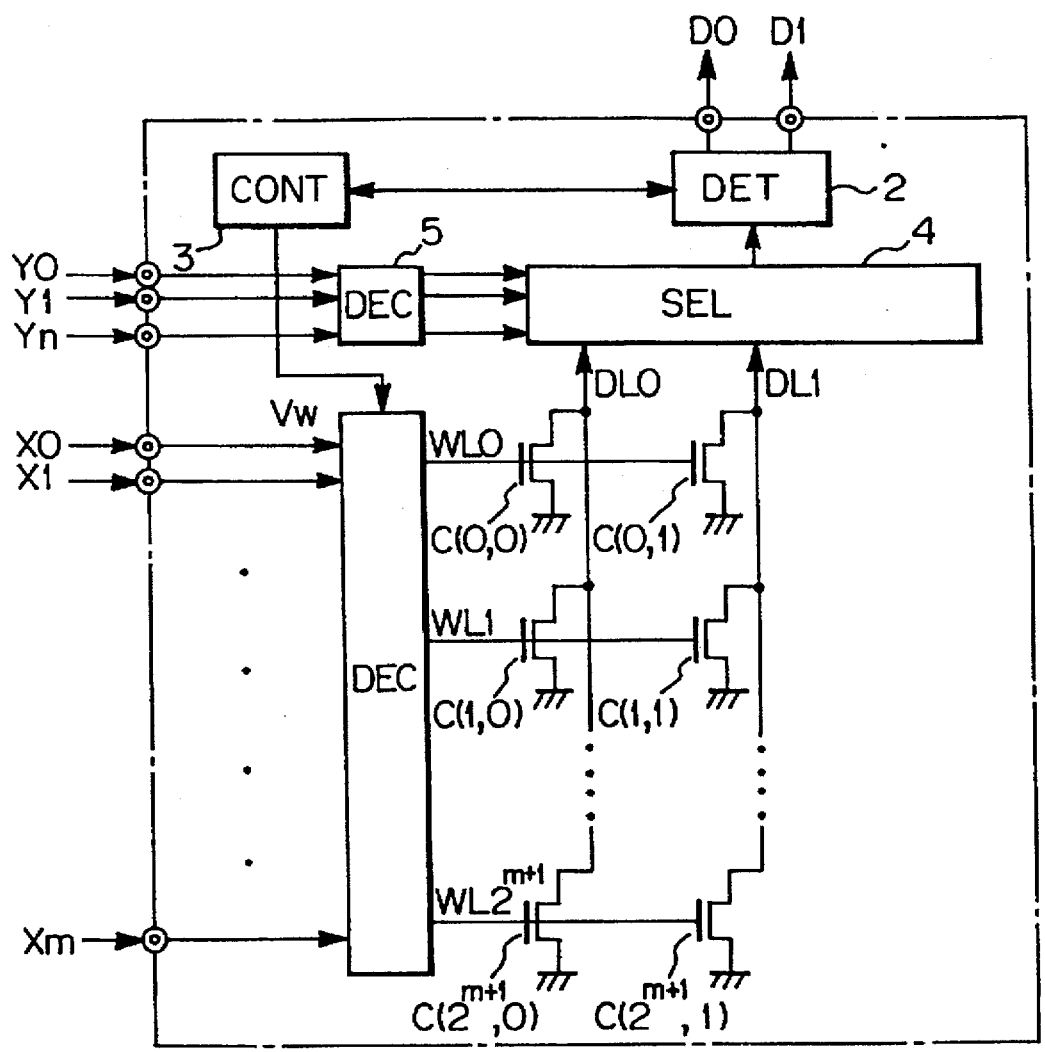
FIG. 3 is a circuit diagram illustrating a second prior art four-valued ROM device.

In FIG. 3, which illustrates a second prior art four-valued ROM device (see: JP-A-4-184794), only one determination circuit 2 is provided instead of the determination circuits 2-0 and 2-1 of FIG. 1. Also, a selector 4 is provided between the digit lines DL0, DL1, ... and the determination circuit 2. Therefore, one of the digit lines DL0, DL1, ... is selected by a column decoder 5 for receiving Y address signals Y0, Y1, ..., Yn, and is connected to the determination circuit 2.

Figure 4:
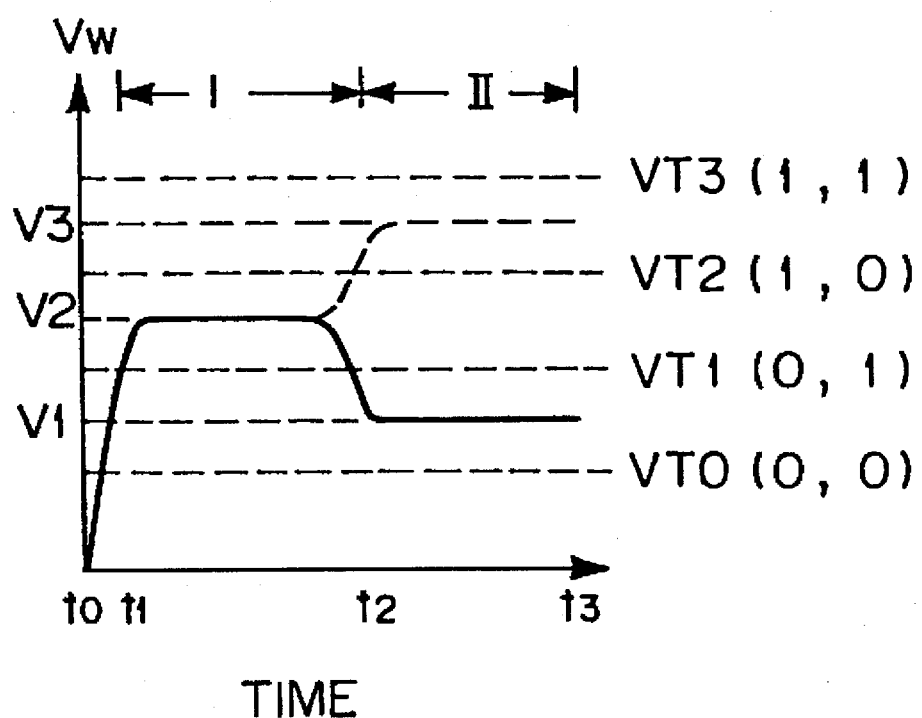
FIG. 4 is a timing diagram showing the read operation of the device of FIG. 3.

The read operation of the device of FIG. 3 is explained next with reference to FIG. 4. Also, assume that the X address signals X0, X1, ..., Xm are all 0, and accordingly, the word line WL0 is selected. Also, assume that the Y address signals Y0, Y1, ..., Yn are all 0, and accordingly, the digit line DL0 is connected via the selector 4 to the determination circuit 2. In this state, first, for a time period I from t1 to t2, the control circuit 3 causes the voltage $V_w$ at the selected word line WL0 to be V2. As a result, if the determination circuit 2 determines that the voltage at the digit line DL0 is 0V, the control circuit 3 causes the voltage $V_w$ the selected word line WL0 to be V1 for a time period II from t2 to t3. Also, if the determination circuit 2 determines that the voltage at the digit line DL0 is 0V, the determination circuit 2 causes the data signals (D0, D1) to be (0, 0). Otherwise, the determination circuit 2 causes the data signals (D0, D1) to be (0, 1).

On the other hand, for the time period I, if the determination circuit 2 determines that the voltage at the digit line DL0 is not 0V, the control circuit 3 causes the voltage $V_w$ at the selected word line WL0 to be V3 for the time period II. As a result, if the determination circuit 2 determines that the voltage at the digit line DL0 is 0V, the determination circuit 2 causes the data signals (D0, D1) to be (1, 0). Otherwise, the determination circuit 2 causes the data signals (D0, D1) to be (1, 1).

In the four-valued ROM device of FIG. 3, it takes only two time periods I and II to obtain the data signals (D0, D1). However, one read access is performed upon only one of the digit lines DL0, DL1, .... Therefore, if four bit data signals are obtained, it takes four time periods. Therefore, a read operation speed is decreased. In addition, the determination circuit 2 and the control circuit 3 are more complex than the determination circuits 2-0 and 2-1 and the control circuit 3 of FIG. 1.

Figure 5:
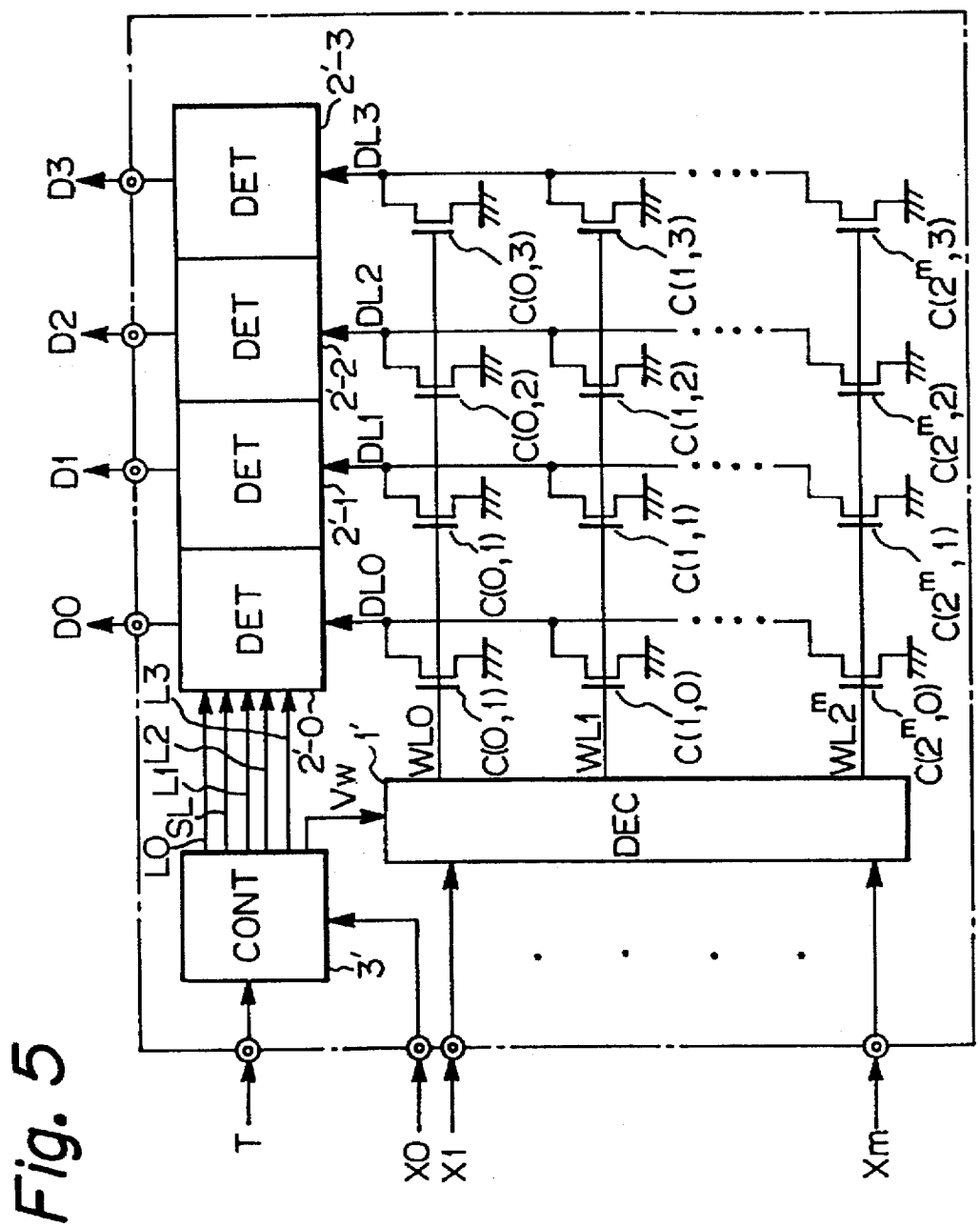
FIG. 5 is a circuit diagram illustrating a first embodiment of the four-valued ROM device according to the present invention.

In FIG. 5, which illustrates a first embodiment of the present invention, the least significant bit X0 of the X address signals is supplied to a control circuit 3', not to an X address decoder 1'. Also, digit lines DL0, DL1, DL2, and DL3 are connected to determination circuits 2'-0, 2'-1, 2'-2, 2'-3, respectively.

The control circuit 3' receives the X address signal X0 as well as a timing signal T to generate latch enable signals L0, L1, L2 and L3, and a selection signal SL. Also, the control circuit 3' generates a voltage $V_w$ applied to a selected word line in synchronization with the latch enable signals L1, L2 and L3. In this case, the voltage $V_w$ is V1 for the latch enable signal L1, the voltage $V_w$ is V2 for the latch enable signal L2, and the voltage $V_w$ is V3 for the latch enable signal L3.

Figure 6:
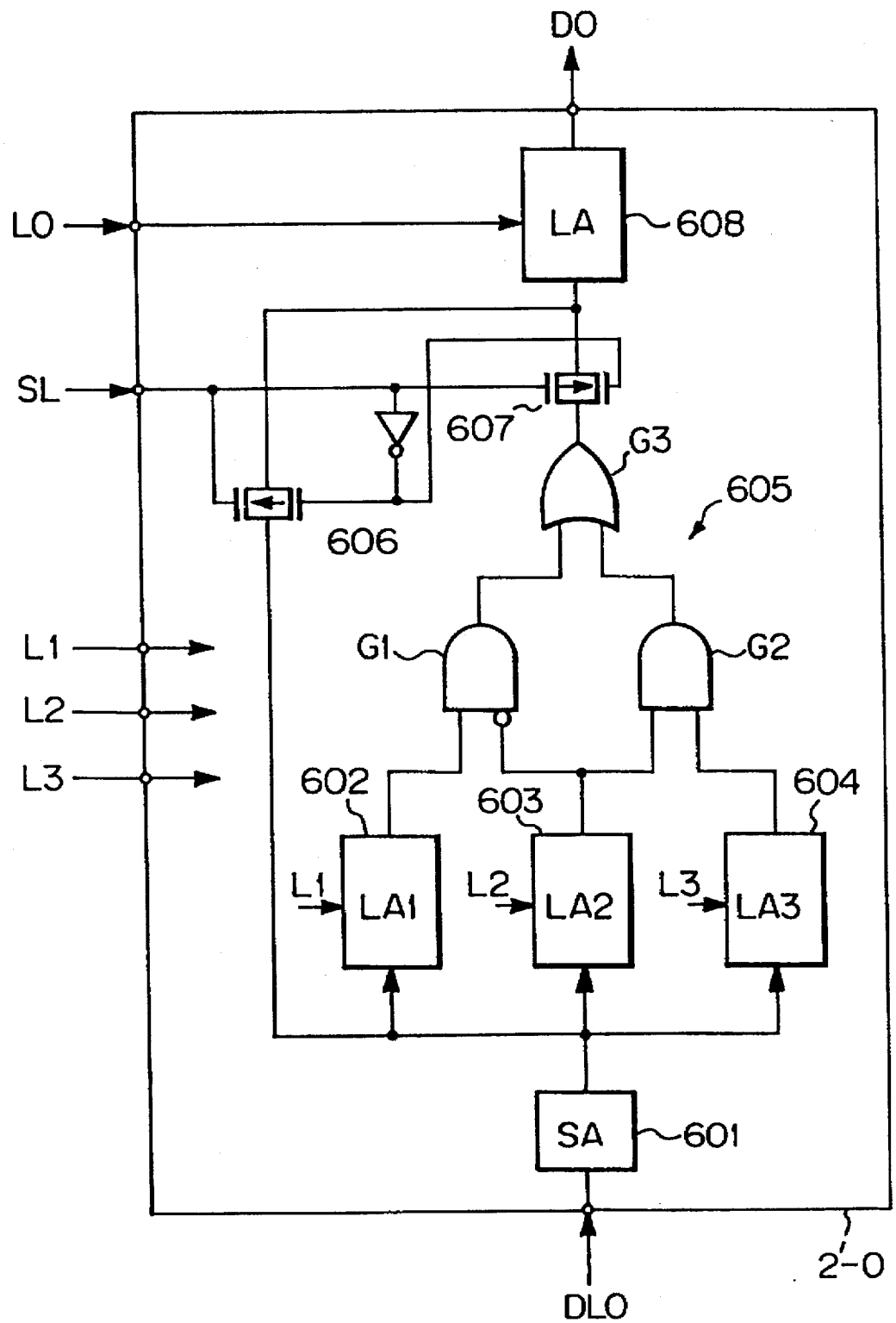
FIG. 6 is a detailed circuit diagram of the determination circuit of FIG. 5.

In FIG. 6, which is a detailed circuit diagram of the determination circuit such as 2'-0 of FIG. 5, reference numeral 601 designates a sense amplifier, and 602, 603 and 604 designate latch circuits for latching the output signal of the sense amplifier 601 in accordance with falling edges of the latch enable signals L1, L2 and L3, respectively. The data LA1, LA2 and LA3 of the latch circuits 602, 603 and 604 for a selected memory cell having threshold voltages VT0, VT1, VT2 and VT3, respectively, are shown in FIG. 7.

Also, reference numeral 605 designates a logic circuit famed by gate circuits G1, G2 and G3 whose output data for a selected memory cell having threshold voltages VT0, VT1, VT2 and VT3, respectively, are also shown in FIG. 7.

Further, reference numerals 606 and 607 designate transfer gates or switches which are turned ON and OFF in accordance with the selection signal SL. That is, when the selection signal SL is high (=1), the switches 606 and 607 are turned ON and OFF, respectively, so that the sense amplifier 601 is connected to a latch circuit 608. On the other hand, when the selection signal SL is low (=0), the switches 606 and 607 are turned OFF and ON, respectively, so that the logic circuit 605 is connected to the latch circuit 608. The latch circuit 608 is operated in accordance with a falling edge of the latch enable signal L0.

Figure 8:
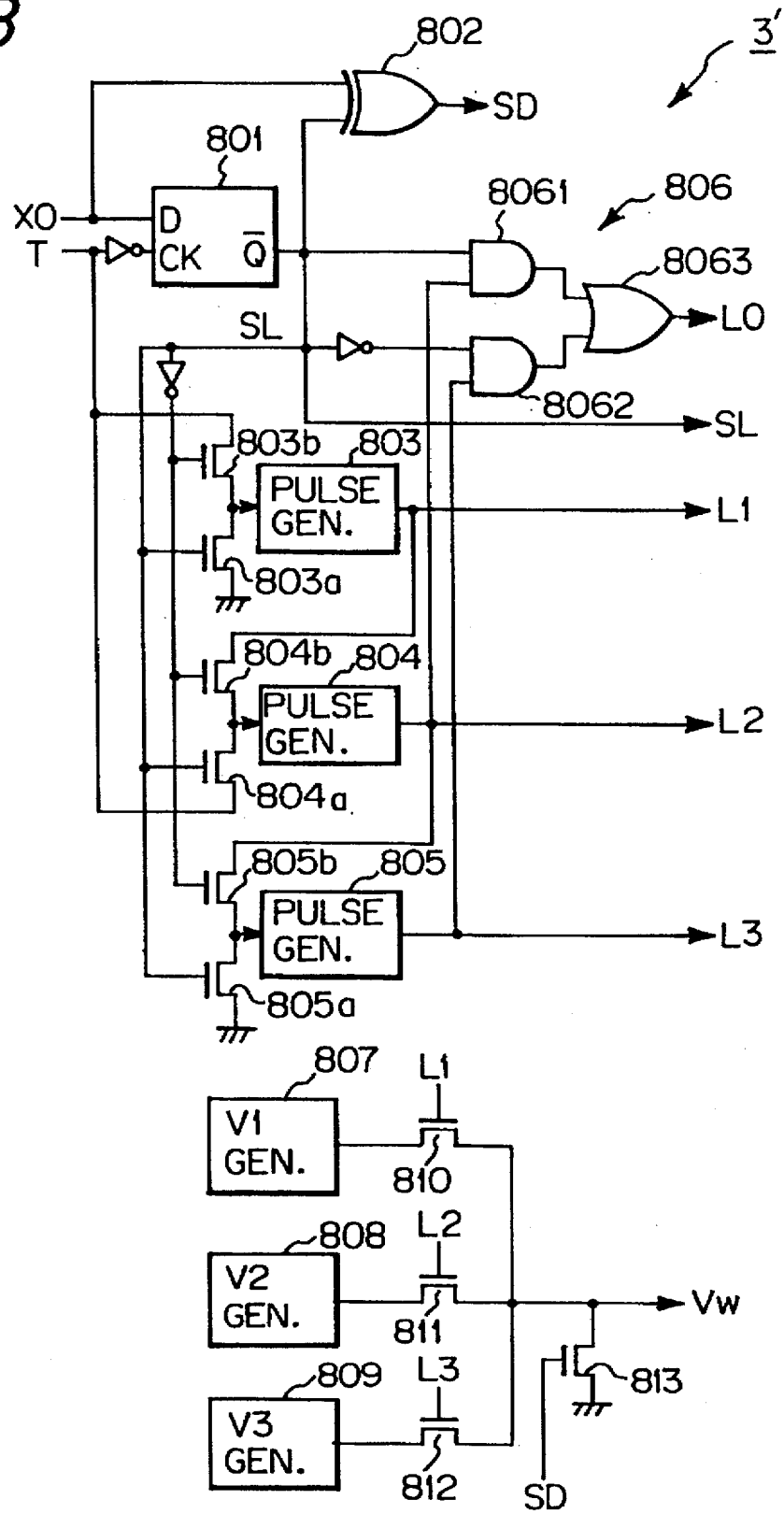
FIG. 8 is a detailed circuit diagram of the control circuit of FIG. 5.

In FIG. 8, which is a detailed circuit diagram of the control circuit 3' of FIG. 5, reference numeral 801 designates a D-type flip-flop for receiving the X address signal X0 and the timing signal T to generate the selection signal SL. Also, an exclusive OR circuit 802 generates a discharging signal SD in accordance with the X address signal X0 and the selection signal SL.

Also, reference numerals 803, 804 and 805 designate pulse generating circuits for generating the latch enable signals L1, L2 and L3, respectively. Transistors 803a and 803b are connected to an input of the pulse generating circuit 803. Also, transistors 804a and 804b are connected to an input of the pulse generating circuit 804. Further, transistors 805a and 805b are connected to an input of the pulse generating circuit 805. The gates of the transistors 803a, 804a and 805a are controlled by the selection signal SL, and also, the timing signal T is supplied to only the transistor 804a while the sources of the transistors 803a and 805a are grounded. Also, the gates of the transistors 803b, 804b and 805b are controlled by an inverted signal of the selection signal SL, and also, the timing signal T, the output L1 of the pulse generating circuit 803 and the output L2 of the pulse generating circuit 804 are supplied to the transistors 803b, 804b and 805b, respectively. Therefore, when the selection signal SL is high (=1), only the pulse generating circuit 804 can be operated in response to the timing signal T. On the other hand, when the selection signal SL is low (=0), all the pulse generating circuits 803, 804 and 805 can be operated.

Also, a logic circuit 806 formed by AND circuits 8061 and 8062 and an OR circuit 8063 are provided for generating the latch enable signal L0. That is, when the selection signal SL is high (=1), the latch enable signal L0 is generated in response to the latch enable signal L2. On the other hand, when the selection signal SL is low (=0), the latch enable signal L0 is generated in response to the latch enable signal L3.

Also, voltage generating circuits 807, 808 and 809 for generating voltages V1, V2 and V3, respectively, and transistors 810, 811, 812 and 813 are provided. In this case, the voltage generating circuits 807, 808 and 809 are comprised of diode-connected transistors. For example, when the latch enable signal L1 is high to turn ON the transistor 810, the voltage $V_w$ at a selected word line is V1. Also, when the discharging signal SD is high to turn ON the transistor 813, the voltage $V_w$ is 0.

Figure 9:
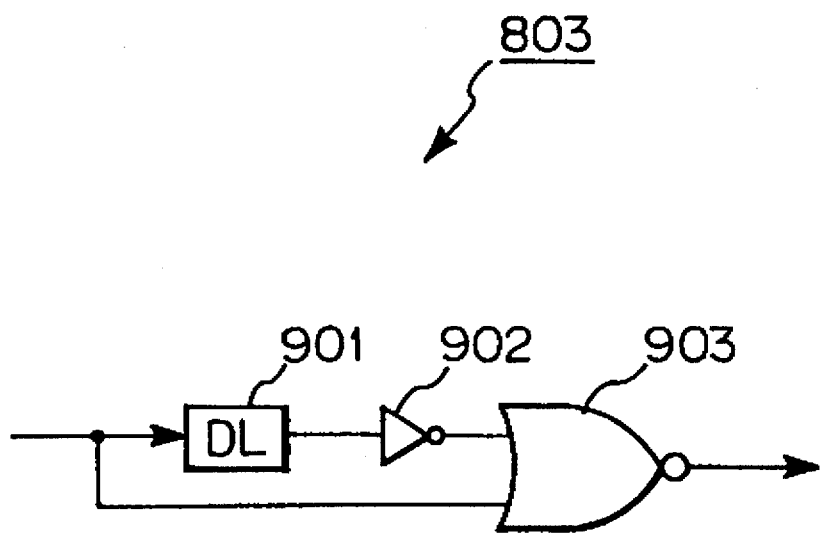
FIG. 9 is a detailed circuit diagram of the pulse generating circuit of FIG. 8.

In FIG. 9, which is a detailed circuit diagram of the pulse generating circuit such as 803 of FIG. 8, the pulse generating circuit 803 is comprised of a delay circuit 901, an inverter 902 and a NOR circuit 903.

The operation of the device of FIGS. 5, 6, 8 and 9 is explained with reference to FIGS. 10, 11 and 12A through 12J. Here, assume that the relationship between the memory cells and the threshold voltages is as shown in FIG. 10, and as a result, the output data D0, D1, D2 and D3 can be expected to be as shown in FIG. 11.

First, cycle 1 of FIG. 11 is explained. Here, the X address signals X1 through Xm are 0.

Figure 12:
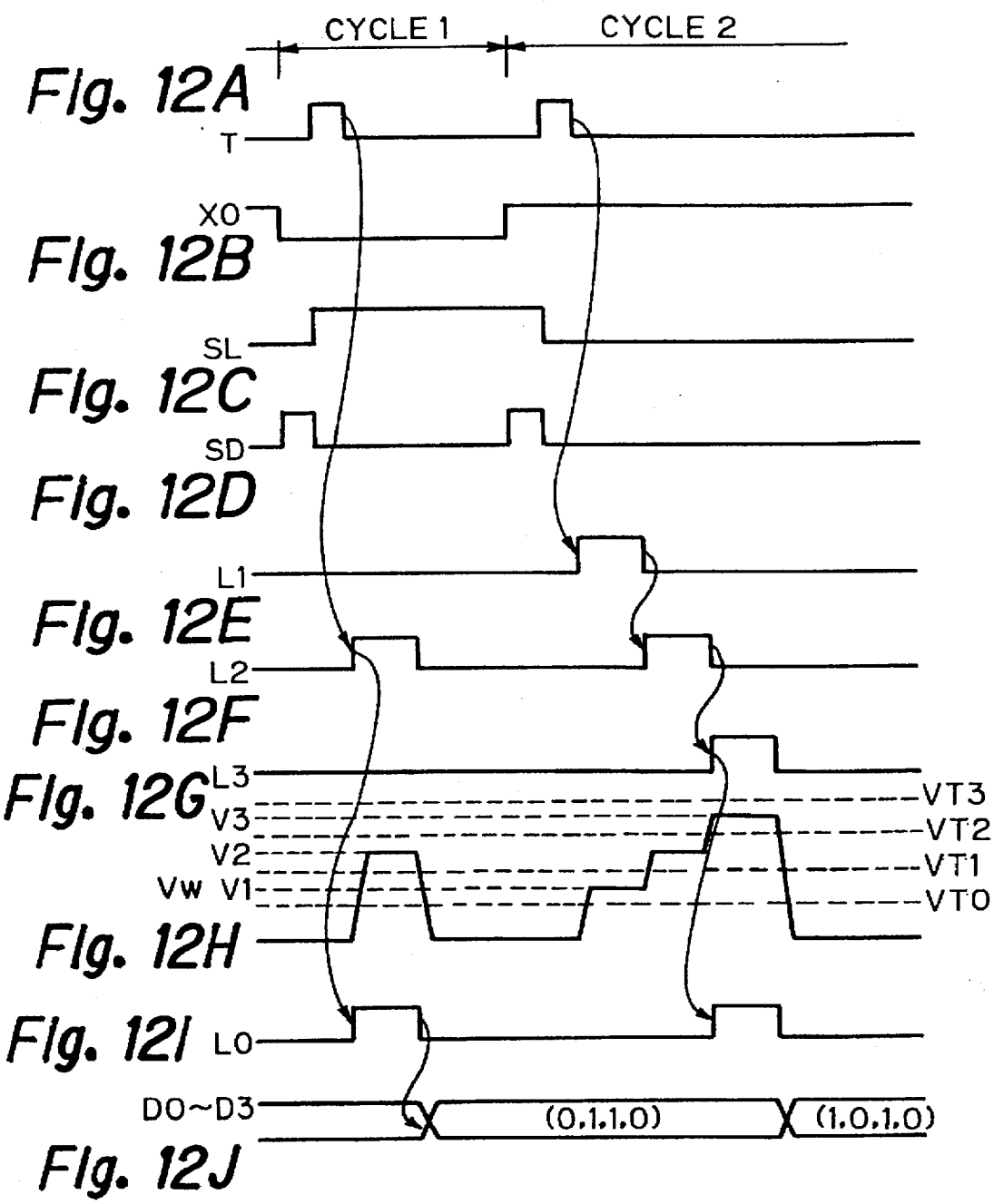
FIGS. 12A through 12J are timing diagrams for explaining the operation of the circuits of FIGS. 5, 6, 8 and 9.

As shown in FIGS. 12A and 12B, the X address signal X0 is changed from high to low, and thereafter, the timing signal T is generated. As a result, the selection signal SL is changed from low to high as shown in FIG. 12C, and the discharging signal SD is generated as shown in FIG. 12D, to discharge the selected word line WL0.

Since the selection signal SL is high, only the pulse generating circuit 804 can be operated. That is, the pulse generating circuit 803 responds to a falling edge of the timing signal T, and as a result, the pulse generating circuit 804 generates a latch enable signal L2 as shown in FIG. 12F. As a result, the voltage $V_w$ at the selected word line WL0 becomes V2 as shown in FIG. 12H. Therefore, the memory cells C(0, 0) and C(0, 3) whose threshold voltages are lower than V2 are turned ON, and the memory cells C(0, 1) and C(0, 2) whose threshold voltages are higher than V2 are turned OFF. Thus, the voltages at the digit lines DL0, DL1, DL2 and DL3 are (0, 1, 1, 0), and are supplied to the sense amplifiers 601. On the other hand, the logic circuit 806 generates a latch enable signal L0 in response to the latch enable signal L2 as shown in FIG. 12I, since the selection signal SL is high to activate the AND circuit 8061.

Thus, the output data (D0, D1, D2, D3) for cycle 1 is (0, 1, 1, 0), as shown in FIG. 12J.

Next, cycle 2 of FIG. 11 is explained. Here, the X address signals X1 through Xm are also 0.

As shown in FIGS. 12A and 12B, the X address signal X0 is changed from low to high, and thereafter, the timing signal T is generated. As a result, the selection signal SL is changed from high to low as shown in FIG. 12C, and the discharging signal SD is generated as shown in FIG. 12D, to discharge the selected word line WL0.

Since the selection signal SL is low, only the pulse generating circuits 803, 804 and 805 can be operated. That is, the pulse generating circuit 803 responds to a falling edge of the timing signal T, and as a result, the pulse generating circuit 803 generates a latch enable signal L1 as shown in FIG. 12E. As a result, the voltage $V_w$ at the selected word line WL0 becomes V1 as shown in FIG. 12H. Next, the pulse generating circuit 804 responds to a falling edge of the latch enable signal L1, and as a result, the pulse generating circuit 804 generates a latch enable signal L2 as shown in FIG. 12F. As a result, the voltage $V_w$ at the selected word line WL0 becomes V2 as shown in FIG. 12H. Further, the pulse generating circuits 805 responds to a falling edge of the latch enable signal L2, and as a result, the pulse generating circuit 805 generates a latch enable signal L3 as shown in FIG. 12G. As a result, the voltage $V_w$ at the selected word line WL0 becomes V3 as shown in FIG. 12H.

Therefore, in the determination circuit 2'-0, "1", "0" and "0" are latched in the latch circuits 602, 603 and 604, respectively, and as a result, the output of the OR circuit G3 is "1". Also, in the determination circuit 2'-1, "1", "1" and "0" are latched in the latch circuits 602, 603 and 604, respectively, and as a result, the output of the OR circuit G3 is "0". Further, in the determination circuit 2'-2, "1", "1" and "1" are latched in the latch circuits 602, 603 and 604, respectively, and as a result, the output of the OR circuit G3 is "1". In addition, in the determination circuit 2'-3, "0", "0" and "0" are latched in the latch circuits 602, 603 and 604, respectively, and as a result, the output of the 0R circuit G3 is "0". On the other hand, the logic circuit 806 generates a latch enable signal L0 in response to the latch enable signal L3 as shown in FIG. 12G, since the selection signal SL is low to activate the AND circuit 8062.

Thus, the output data (D0, D1, D2, D3) for cycle 2 is (1, 0, 1, 0).

A similar operation to that carried out for cycle 1 is carried out for cycles 3, 5, . . . , $2^{m+1}-1$ as shown in FIG. 11, and a similar operation to that carried out for cycle 2 is carried out for cycles 2, 4, . . . , $2^{m+1}$ as shown in FIG. 11.

In the first embodiment, data accessed by two addresses is stored in each of the four-valued memory cells. As a result, output data, whose number is the same as that of the digit lines, can be obtained by one address. Also, in half of the cycles, only one step voltage is applied to a selected word line, while, in the other half of the cycles, a three-step voltage is applied to a selected word line. This increases the read operation speed.

Figure 13:
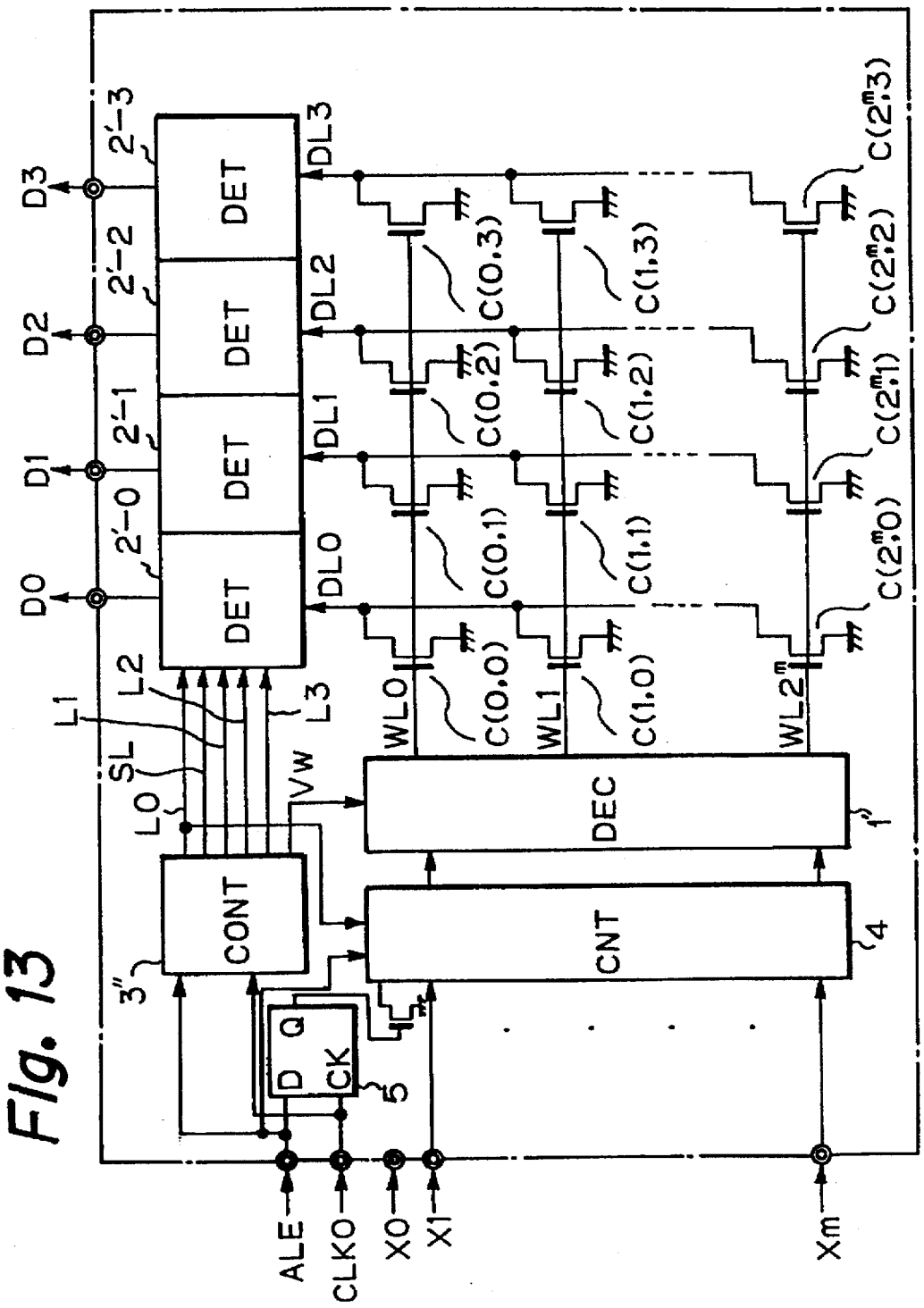
FIG. 13 is a circuit diagram illustrating a second embodiment of the four-valued ROM device according to the present invention.

In FIG. 13, which illustrates a second embodiment of the present invention, a control circuit 3" is provided instead of the control circuit 3' of FIG. 5, and an address counter 4 and an initial circuit 5 for initializing the address counter 4 are added to the elements of FIG. 5. In this case, the external X address signal X0 is not used; however, an internal X address signal X0 is generated within the address counter 4. The control circuit 3" and the initial circuit 5 are controlled by an address latch enable signal ALE and a clock signal CLKO. Also, the address counter 4 receives the latch enable signal L0 from the countrol circuit 3".

Figure 14:
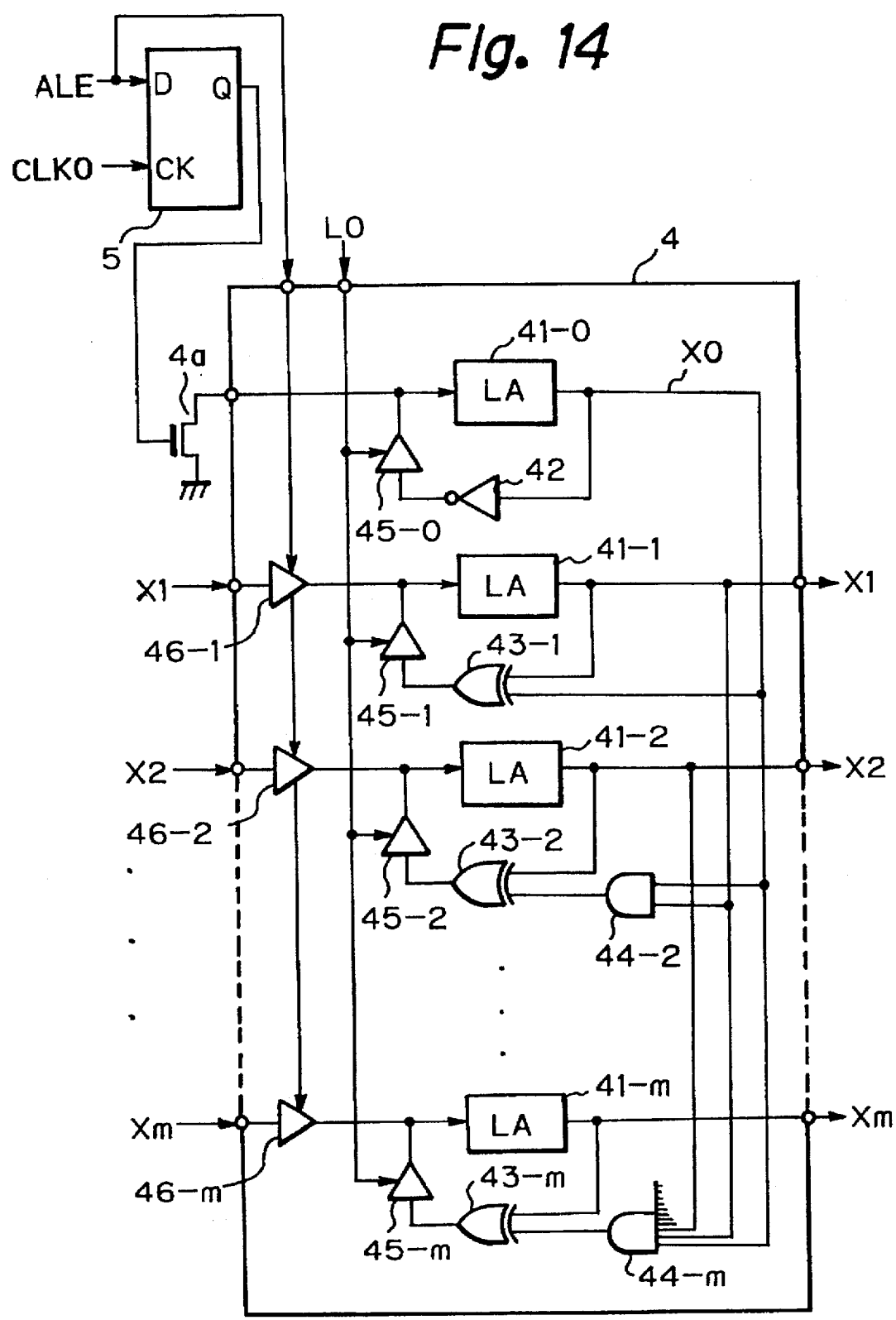
FIG. 14 is a detailed circuit diagram of the address counter of FIG. 13.

In FIG. 14, which is a detailed circuit diagram of the address counter 4 of FIG. 13, latch circuits 41-0, 41-1, ... , 41-m are provided for the internal X address signal X0, and the external X address address signals X1 through Xm, respectively. Also, an inverter 42, exclusive OR circuits 43-1 through 43-m, AND circuits 44-2 through 44-m and tri-state buffers 45-0 through 45-m are provided for carrying out an incrementing operation. That is, when the tri-state buffers 45-0, 45-1, ... , 45-m are activated by the latch enable signal L0 of the control circuit 3", the address stored in the latch circuits 41-0, 41-1, ... , 41-m is incremented by +1. Also, tri-state buffers 46-1, 46-2, ... , 46-m are provided for latching the external X address signals X1, X2, ... , Xm in the latch circuits 41-1, 41-2, ... , 41-m. That is, when the tri-state buffers 46-1, 46-2, ... , 46-m are activated by the latch enable signal ALE, the external X address signals X1, X2, ... , Xm are latched in the latch circuits 41-1, 41-2, . . , 41-m. In this case, a transistor 4a is turned ON by the initial circuit 5, so that 0 is latched in the latch circuit 41-0.

Figure 15:
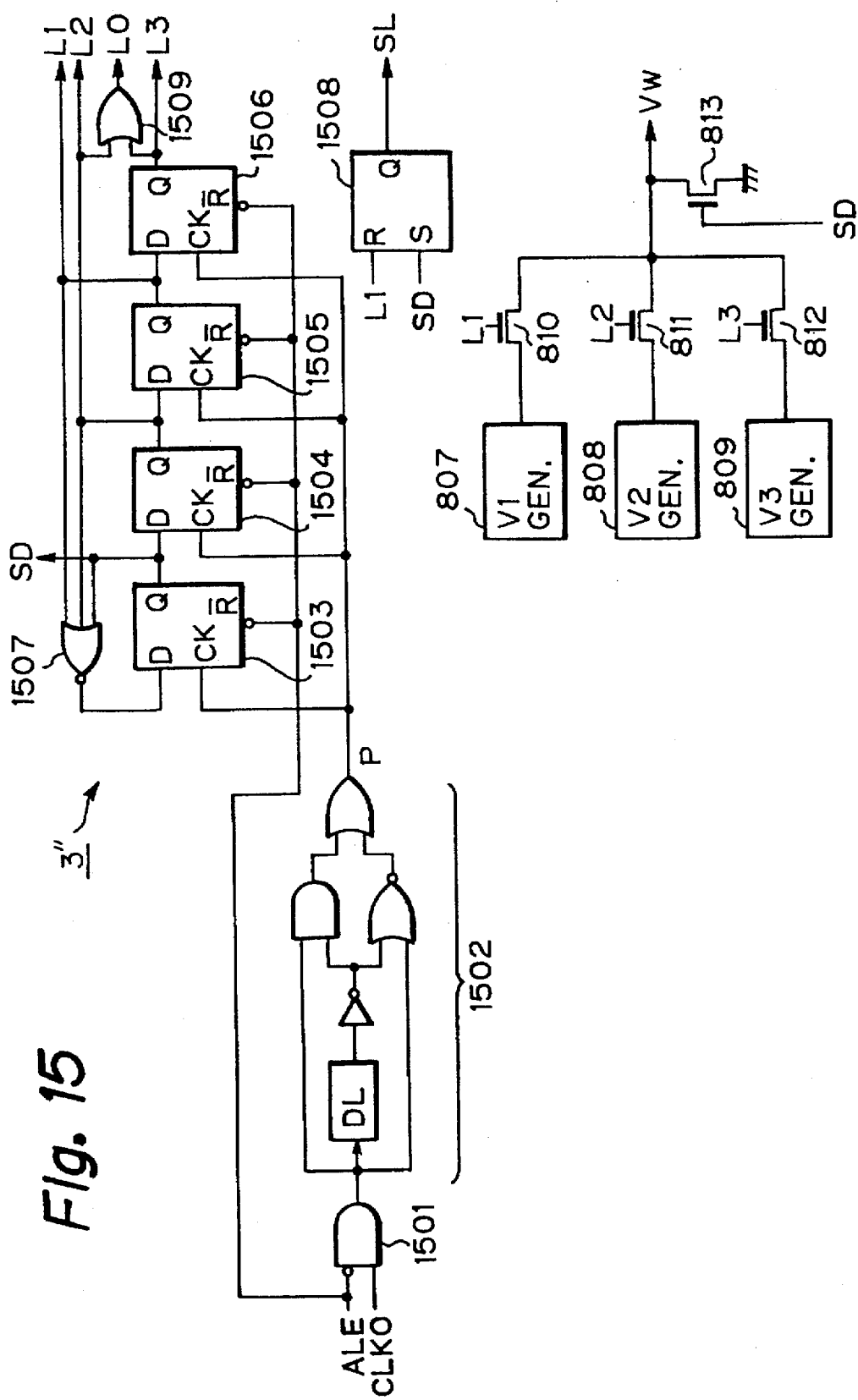
FIG. 15 is a detailed circuit diagram of the control circuit of FIG. 13.

In FIG. 15, which is a detailed circuit diagram of the control circuit 3" of FIG. 13, the control circuit 3" includes a gate circuit 1501 and a one-shot pulse generating circuit 1502. That is, when the address latch enable signal ALE is inactive (=0), the one-shot pulse generating circuit 1502 generates a one-shot pulse signal P in response to 'the clock signal CLKO.

Also, flip-flops 1503, 1504, 1505 and 1506, and a NOR circuit 1507 are provided for generating the discharging signal SD and the latch enable signals L1, L2 and L3 for the latch circuits 602, 603 and 604 of the determination circuit such as 2'-0 of FIG. 6. The flip-flops 1503, 1504, 1505 and 1506 receive the one-shot pulse signal P and are reset by the address latch enable ALE.

Also, a flip-flop 1508 is provided for generating the selection signal SL. The flip-flop 1508 is set by a rising edge of the discharging signal SD and is reset by a rising edge of the latch enable signal L1.

Further, an OR circuit 1509 is provided to receive the latch enable signals L2 and L3 to generate the latch enable signal L0.

Note that the voltage generating circuits 807, 808 and 809 and the transistors 810, 811, 812 and 813 are the same as those of FIG. 8.

The operation of the device of FIGS. 13, 6, 14, 15 is explained with reference to FIGS. 10, 11 and 16A through 16M. Again, assume that the relationship between the memory cells and the threshold voltages is as shown in FIG. 10, and as a result, the output data D0, D1, D2 and D3 can be expected to be as shown in FIG. 11.

First, when the address latch enable signal ALE is changed from high to low as shown in FIG. 16A, external X address signals X1 through Xm as shown in FIG. 16B are latched in the latch circuits 41-1, 41-2, ... , 41-m of the address counter 4, and therefore, internal X address signals X1 through Xm including an X address signal X0 are changed as shown in FIG. 16C. Simultaneously, a clock signal CLKO as shown in FIG. 16E is supplied via the gate circuit 1501 to the one-shot pulse generating circuit 1502 of FIG. 15, thus generating a one-shot pulse signal P as shown in FIG. 16F.

First, cycle 1 of FIG. 11 is explained. Here, the X address signals X1 through Xm are 0.

As shown in FIGS. 16G and 16H, the discharging signal SD and the latch enable signal L2 are sequentially generated.

As a result, the selection signal SL is high as shown in FIG. 16K. Also, the discharging signal SD discharges the selected word line WL0. Thereafter, the voltage $V_w$ at the selected word line WL0 becomes V2. Therefore, the memory cells C(0, 0) and C(0, 3) whose threshold voltages are lower than V2 are turned ON, and the memory cells C(0, 1) and C(0, 2) whose threshold voltages are higher than V2 are turned OFF. Thus, the voltages at the digit lines DL0, DL1, DL2 and DL3 are (0, 1, 1, 0), and are supplied to the sense amplifiers 601. Also, the output data (0, 1, 1, 0) are latched in the latch circuits 603 of the determination circuits 2'-0, 2'-1, 2'-2 and 2'-3 in response to the latch enable signal L2. On the other hand, the OR circuit 1509 generates a latch enable signal L0 in response to the latch enable signal L2 as shown in FIG. 16K. Thus, the output data (D0, D1, D2, D3) for cycle 1 is (0, 1, 1, 0), as shown in FIG. 16M.

Also, at the end of cycle 1, the content of the address counter 4 is incremented by +1 using the latch enable signal L0. In this case, only the internal X address signal X0 is changed from low (=0) to high (=1) as shown in FIG. 16D, thus entering cycle 2.

Next, cycle 2 of FIG. 11 is explained. Here, the X address signals X1 through Xm are also 0.

As shown in FIGS. 16I and 16J, the latch enable signal L1 and the latch enable signal L3 are sequentially generated. Note that the latch enable signal L2 is already generated in cycle 1.

Therefore, in the determination circuit 2'-0, "1", "0" and "0" are latched in the latch circuits 602, 603 and 604, respectively, and as a result, the output of the OR circuit G3 is "1". Also, in the determination circuit 2'-1, "1", "1" and "0" are latched in the latch circuits 602, 603 and 604, respectively, and as a result, the output of the OR circuit G3 is "0". Further, in the determination circuit 2'-2, "1", "1" and "1" are latched in the latch circuits 602, 603 and 604, respectively, and as a result, the output of the OR circuit G3 is "1". In addition, in the determination circuit 2'-3, "0", "0" and "0" are latched in the latch circuits 602, 603 and 604, respectively, and as a result, the output of the OR circuit G3 is "0". On the other hand, the OR circuit 1509 generates a latch enable signal L0 in response to the latch enable signal L3 as shown in FIG. 16L. Thus, the output data (D0, D1, D2, D3) for cycle 2 is (1, 0, 1, 0).

Also, at the end of cycle 2, the content of the address counter 4 is incremented by +1 using the latch enable signal L0, thus entering cycle 3.

Also, in the second embodiment, data accessed by two addresses is stored in each of the four-valued memory cells. As a result, output data, whose number is the same as that of the digit lines, can be obtained by one address. Also, in half of the cycles, only one step voltage is applied to a selected word line, while, in the other half of the cycles, a two-step voltage is applied to a selected word line. This further increases the read operation speed.

The present invention can be applied to multivalued ROM devices other than a four-valued ROM device.

As explained hereinbefore, according to the present invention, since the number of changes of a voltage applied to a selected word line is reduced, the read operation speed can be increased.

We claim:

1. A multivalued read only memory device comprising:
   a plurality of memory cells each for storing N (N=2, 3, . . . )-bit information;
   selecting means for selecting at least one of said memory cells in accordance with address information; and
   reading means for reading one bit of the N-bit information of one memory cell of said plurality of memory cells in accordance with a first address, and reading another bit of the N-bit information from said one memory cell in accordance with a second address.

2. A four-valued read only memory device including at least one memory cell transistor, accessed by an address comprising:
   first outputting means for applying a first voltage to a gate of said memory cell transistor and outputting a first output signal indicating whether said memory cell transistor is turned ON or OFF; and
   second outputting means for individually applying said first voltage, and second and third voltages to the gate of said memory cell transistor and outputting a second output signal in accordance with whether said memory cell transistor is turned ON or OFF when said first voltage is applied to the gate of said memory cell, whether said memory cell transistor is turned ON or OFF when said second voltage is applied to the gate of said memory cell, and whether said memory cell transistor is turned ON or OFF when said third voltage is applied to the gate of said memory cell,
   said first outputting means being operated when said address indicates a first value,
   said second outputting means being operated when said address indicates a second value.

3. The device as set forth in claim 2, wherein said first voltage is between said second voltage and said third voltage.

4. The device as set forth in claim 2, wherein said first outputting means comprises first storing means for storing information indicating whether said memory cell transistor is turned ON or OFF when said first voltage is applied to the gate of said memory cell transistor, an output of said first storing means being output as said first output signal,
   said second outputting means comprising:
      second storing means for storing information indicating whether said memory cell transistor is turned ON or OFF when said first voltage is applied to the gate of said memory cell transistor;
      third storing means for storing information indicating whether said memory cell transistor is turned ON or OFF when said second voltage is applied to the gate of said memory cell transistor;
      fourth storing means for storing information indicating whether said memory cell transistor is turned ON or OFF when said third voltage is applied to the gate of said memory cell transistor; and
      a logic circuit, connected to said second, third and fourth storing means, for performing a logic operation upon information stored in said second, third and fourth storing means, an output of said logic circuit being output as said second output signal.

5. A four-valued read only memory device comprising:
   a plurality of word lines;
   a plurality of digit lines;
   a plurality of memory cell transistors provided at intersections between said word lines and said digit lines, each of said memory cell transistors having one of first, second, third and fourth threshold voltages, said first threshold voltage being lower than said second threshold voltage, said second threshold voltage being lower than said third threshold voltage, said third voltage being lower than said fourth voltage;
   an address decoder for selecting one of said word lines in accordance with a first part of an address;
   first means for applying a first voltage between said second and third threshold voltages to the one of said word lines when a second part of said address indicates a first value;
   second means for individually applying said first voltage, a second voltage between said first and second threshold voltages and a third voltage between said third and fourth threshold voltages to the one of said word lines when the second part of said address indicates a second value;
   a plurality of determination circuits, each connected to one of said digit lines, for generating output signals in accordance with voltages at said digit lines.

6. The device as set forth in claim 5, further comprising an address counter, connected to said address decoder, for incrementing said address.

7. A four-valued read only memory device comprising:
   a plurality of word lines;
   a plurality of digit lines;
   a plurality of memory cell transistors provided at intersections between said word lines and said digit lines, each of said memory cell transistors having one of first, second, third and fourth threshold voltages, said first threshold voltage being lower than said second threshold voltage, said second threshold voltage being lower than said third threshold voltage, said third voltage being lower than said fourth voltage;
   an address counter for receiving an external address and an internal address bit to sequentially generate an internal address;
   an address decoder, connected to said address counter, for selecting one of said word lines in accordance with of said internal address;
   first means for applying a first voltage between said second and third threshold voltages to the one of said word lines When said internal address bit internal indicates a first value;
   second means for individually applying a second voltage between said first and second threshold voltages and a third voltage between said third and fourth threshold voltages to the one of said word lines when the said internal address bit indicates a second value;
   a plurality of determination circuits, each connected to one of said digit lines, for generating output signals in accordance with voltages at said digit lines.

8. The device as set forth in claim 7, wherein said determination circuits generate said output signals in accordance with only information indicating whether the voltage at said digit lines are high or low when said first voltage is applied to the one of said word lines, when said internal address bit indicates the first value,
   said determination circuits generating said output signals in accordance with information indicating whether the voltage at said digit lines are high or low when said first voltage is applied to the one of said word lines, information indicating whether the voltage at said digit lines are high or low when said second voltage is applied to the one of said word lines, and information indicating whether the voltage at said digit lines are high or low when said third voltage is applied to the one of said word lines, when said internal address bit indicates the second value.

9. The multivalued read only memory device as set forth in claim 1, wherein said reading means has one output terminal per each one of a plurality of digit lines, each one of said plurality of digit lines connecting in a column a portion of said plurality of memory cells.

10. The multivalued read only memory device as set forth in claim 1, wherein a read access is determined by one address so as to read said one bit of said N-bit information of said one memory cell and reduce a number of threshold voltages applied to said one memory cell.

11. A multivalued read only memory device comprising:

a plurality of memory cells each for storing N (N=2, 3, . . . )-bit information;

a plurality of digit lines each connected to a portion of said plurality of memory cells; and a plurality of detection circuits each having only one single-bit output terminal and connected to one of said plurality of digit lines.

12. The multivalued read only memory device as set forth in claim 11, further comprising a controller circuit connected to said plurality of detection circuits and providing a plurality of latch enable signals and a selection signal to each of said plurality of detection circuits.

13. The multivalued read only memory device as set forth in claim 12, wherein each of said plurality of detection circuits further comprises:

a sense amplifier having and input and an output and connected to one of said digit lines at said input;

a first, second, and third latch circuits connected to said output of said sense amplifier and each responsive to a respective one of said plurality of latch enable signals so as to latch outputs of said sense amplifier;

a logic circuit connected to said first, second, and third latch circuits;

a forth latch circuit responsive to another of said plurality of latch enable signals, its output being said one single-bit output terminal; and a switching means responsive to said selection signal so as to selectively connect said logic circuit and said sense amplifier to said forth latch circuit at respective times according to a high or low of said selection signal.

14. The multivalued read only memory device as set forth in claim 13, further comprising:

a decoder circuit connected to a plurality of word lines for selectively applying voltage to the gates of said plurality of memory cells in response to address information;

an address counter connected to said decoder circuit; and an initializing circuit connected to said address counter and said controller circuit, for initializing the address counter.

15. The multivalued read only memory device as set forth in claim 14, whereby one bit of the N-bit information is read from one memory cell of said plurality of memory cells in response to a first address, and reading another bit of the N-bit information is read from said one memory cell in response with a second address.

16. A method for reading N-bit information from a multivalued read only memory device, comprising the steps of:

providing at least one memory cell transistor accessed by address information;

applying a first voltage to a gate of said memory cell transistor in response to a first address value and outputting a first output signal, from a first outputting means, indicating whether said memory cell transistor is turned ON or OFF; and applying individually said first voltage, and second and third voltages to the gate of said memory cell transistor in response to a second address value and outputting a second output signal, from a second outputting means, in accordance with whether said memory cell transistor is turned ON or OFF when said first voltage is applied to the gate of said memory cell, whether said memory cell transistor is turned ON or OFF when said second voltage is applied to the gate of said memory cell, and whether said memory cell transistor is turned ON or OFF when said third voltage is applied to the gate of said memory cell.

17. The method for reading N-bit information from a multivalued read only memory device as recited in claim 16, wherein said first voltage is between said second voltage and said third voltage.

18. The method for reading N-bit information from a multivalued read only memory device as recited in claim 17, further comprising the step of providing a plurality of read access cycles for read access of said memory cell transistor which has stored N (N=2, 3, . . . )-bit information, wherein said step of applying said first voltage to a gate of said memory cell transistor in response to a first address value occurs in a first half of said plurality of read access cycles to read one bit of said N-bit information, and said step of applying individually said first voltage, and second and third voltages to the gate of said memory cell transistor in response to a second address value occurs in the other half of said plurality of read access cycles to read another bit of said N-Bit information from a same memory cell.

19. The method for reading N-bit information from a multivalued read only memory device as recited in claim 18, whereby a number of threshold voltages necessary to read N-bit data from said memory cell transistor is reduced and speed of a read operation is increased.

20. A method for reading N-bit information from a multivalued read only memory device, comprising the steps of:

providing a plurality of read access cycles for read access of a plurality of memory cells each storing N (N=2, 3, . . . )-bit information;

applying one step voltage to at least one of said plurality of memory cells in a first half of said plurality of read access cycles to read one bit of said N-bit information; and applying a three step voltage to at least one of said plurality of memory cells in the other half of said plurality of read access cycles to read another bit of said N-Bit information from a same memory cell.

* * * * *